US012674704B2

(12) United States Patent (10) Patent No.: US 12,674,704 B2
Ichihashi et al. (45) Date of Patent: Jul. 7, 2026

(54) SIGNAL GENERATION CIRCUIT AND LIGHT DETECTING UNIT

(71) Applicant: Sony Semiconductor Solutions Corporation, Kanagawa (JP)

(72) Inventors: Masahiro Ichihashi, Fukuoka (JP); Takashi Moue, Kanagawa (JP); Kaede Miyauchi, Kanagawa (JP); Daisuke Arima, Fukuoka (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 160 days.

(21) Appl. No.: 18/836,991

(22) PCT Filed: Feb. 9, 2023

(86) PCT No.: PCT/JP2023/004393
§ 371 (c)(1),
(2) Date: Aug. 8, 2024

(87) PCT Pub. No.: WO2023/176222
PCT Pub. Date: Sep. 21, 2023

(65) Prior Publication Data
US 2025/0035484 A1 Jan. 30, 2025

(30) Foreign Application Priority Data
Mar. 17, 2022 (JP) ................................. 2022-042857

(51) Int. Cl.
*G01J 1/46* (2006.01)
*H03F 3/19* (2006.01)
(52) U.S. Cl.
CPC . *G01J 1/46* (2013.01); *H03F 3/19* (2013.01)
(58) Field of Classification Search
CPC .... G01J 1/46; H03F 3/19; H03K 7/08; H03K 4/50; H03M 1/123; H03M 1/0624; H03M 1/56; H04N 25/78
See application file for complete search history.

(56) References Cited

U.S. PATENT DOCUMENTS

2021/0351768 A1* 11/2021 Fan ....................... H03M 1/007
2024/0031708 A1* 1/2024 Iwata ..................... H04N 25/78

FOREIGN PATENT DOCUMENTS

JP 2003060507 A 2/2003
JP 2013085104 A 5/2013
WO 2021261072 A1 12/2021

OTHER PUBLICATIONS

International Search Report (PCT/ISA/210), International Application No. PCT/JP2023/004393, dated May 9, 2023.

* cited by examiner

*Primary Examiner* — Tony Ko
(74) *Attorney, Agent, or Firm* — Michael Best & Friedrich LLP

(57) ABSTRACT

A signal generation circuit according to one embodiment of the present disclosure includes: an amplifier including a first input section, a second input section, and an output section; a first electric current source that makes it possible to supply an electric current on the basis of an output voltage of the output section; a first capacitor element configured to hold a voltage; a first switch configured to electrically couple the first electric current source and the first capacitor element to each other; a second switch configured to electrically couple the first capacitor element and the first input section to each other; a second capacitor element configured to hold a voltage; a third switch configured to electrically couple the first electric current source and the second capacitor element to each other; and a fourth switch configured to electrically couple the second capacitor element and the first input section to each other.

14 Claims, 13 Drawing Sheets

[ FIG. 1 ]
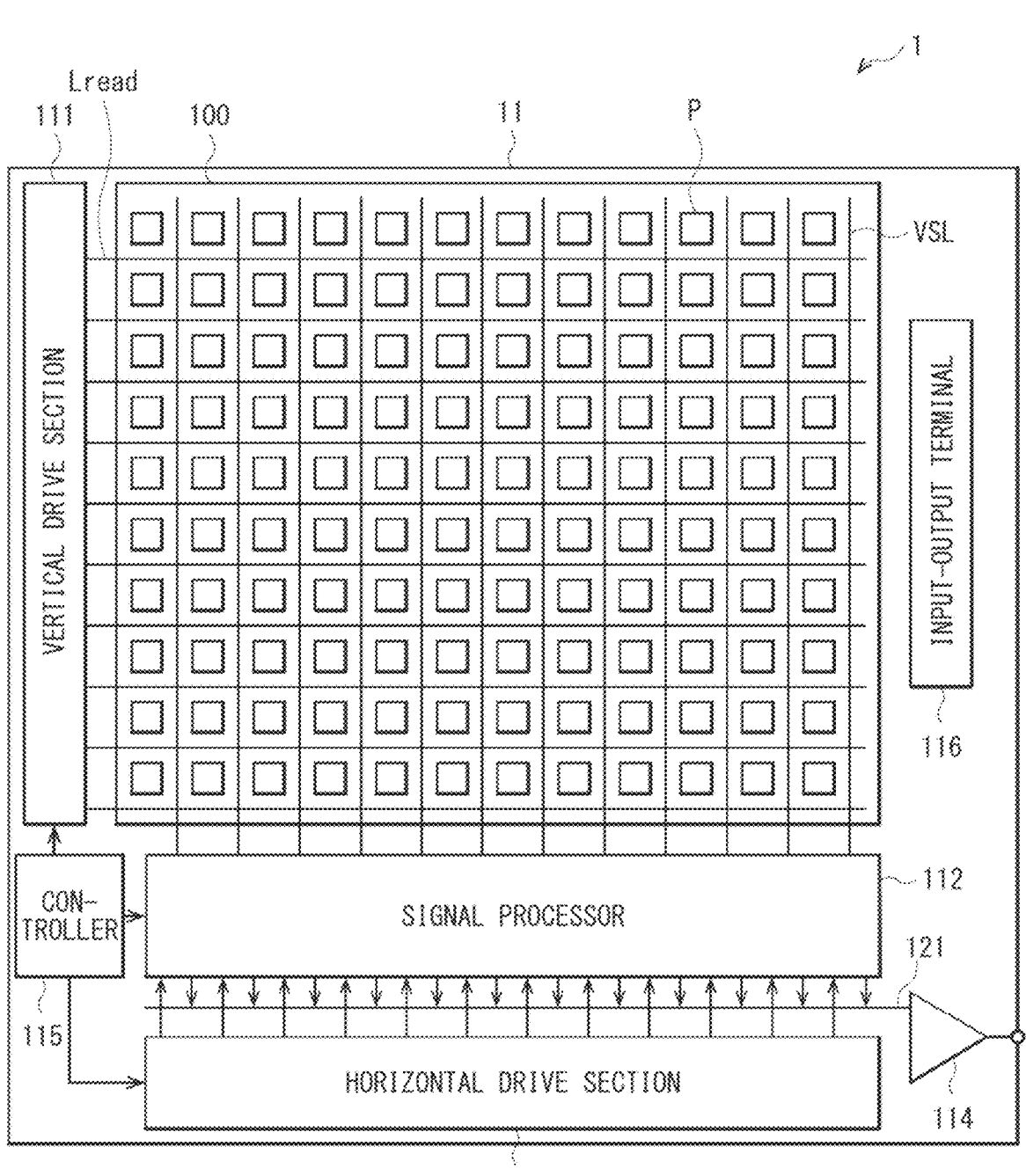

[ FIG. 2 ]
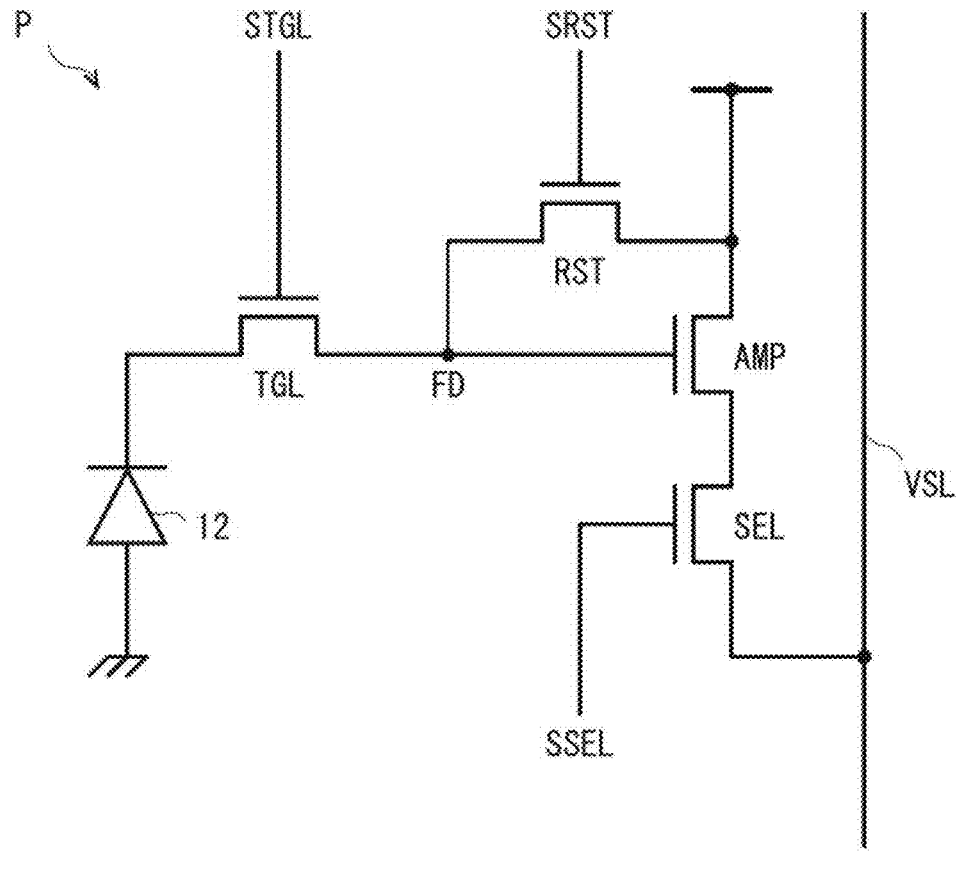

[ FIG. 3 ]
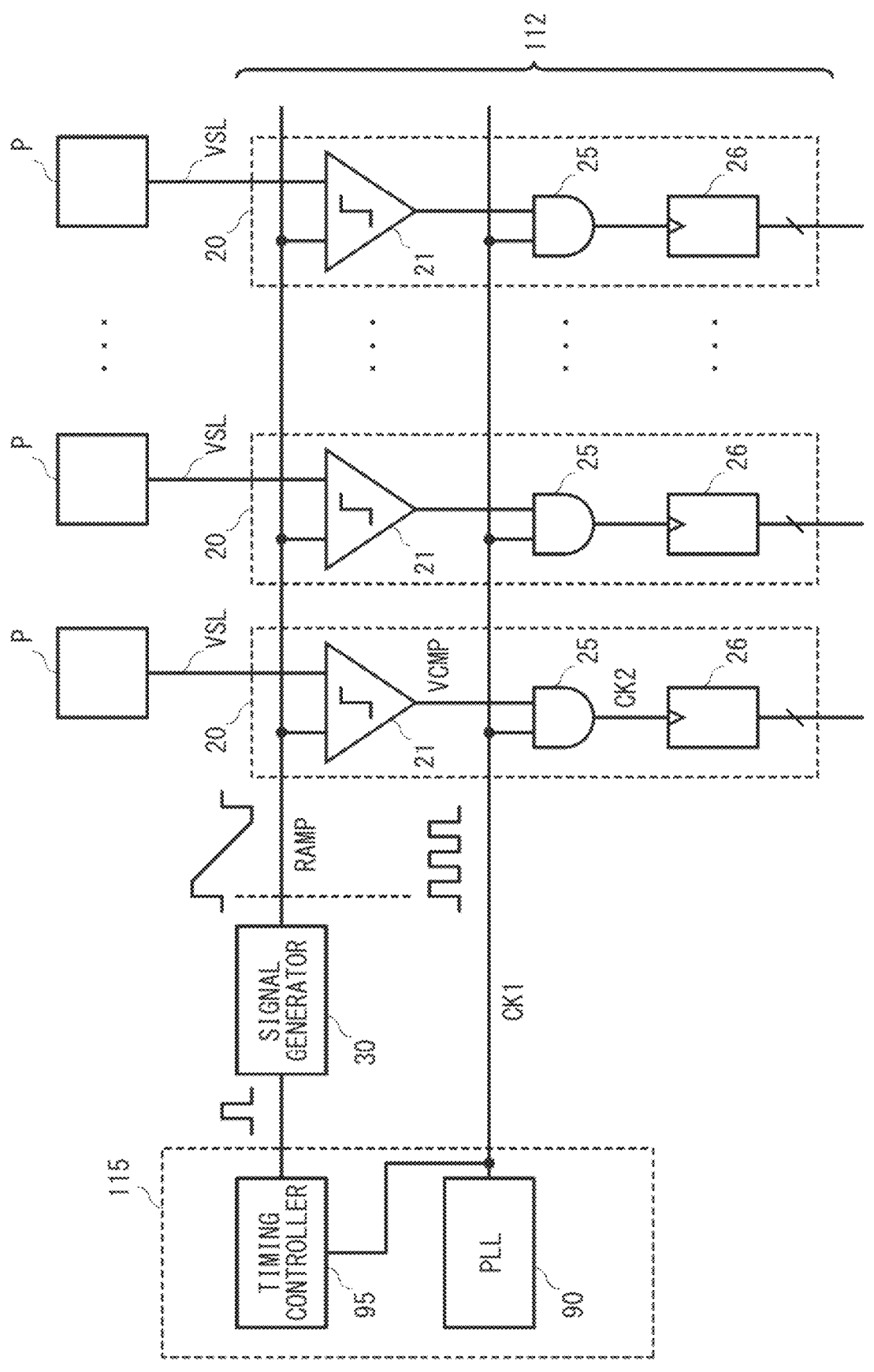

[ FIG. 4 ]
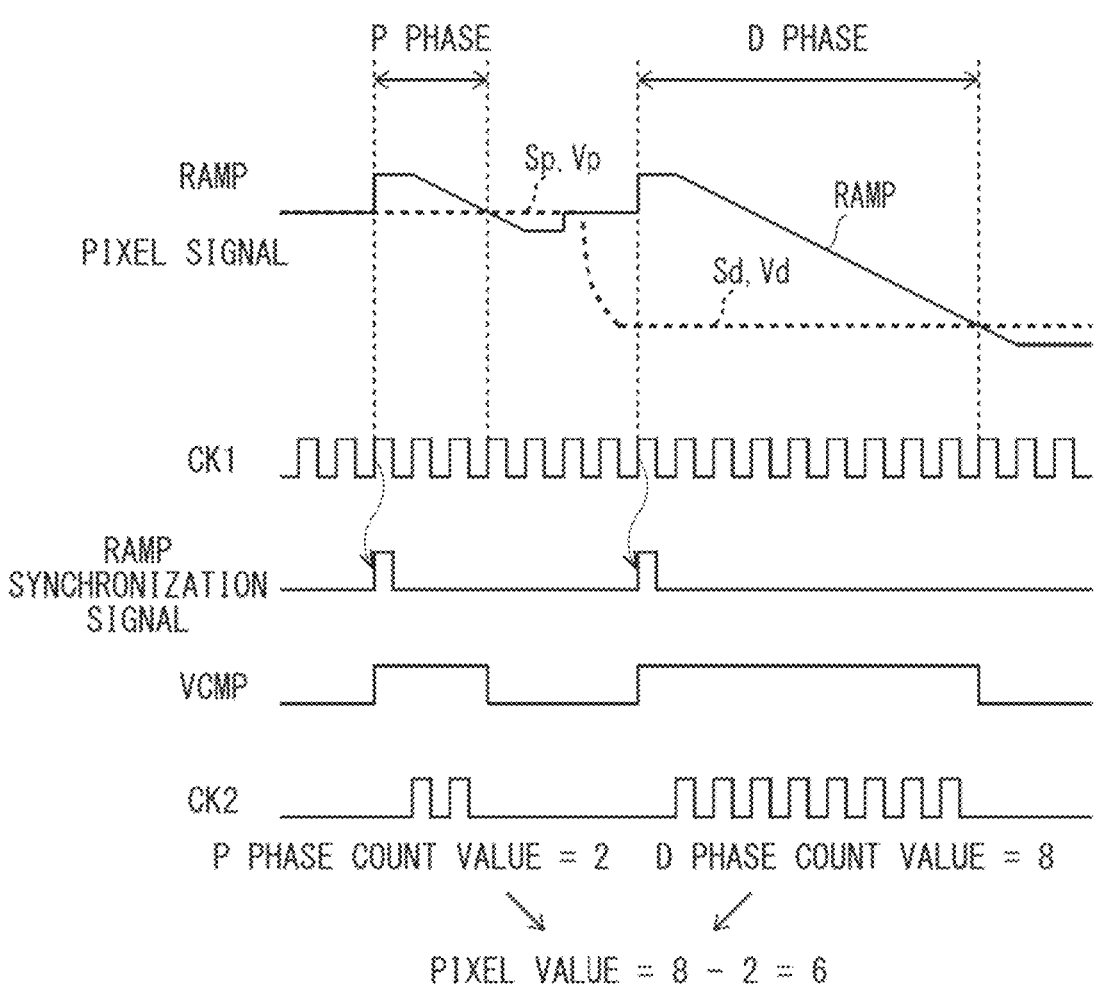

[ FIG.5 ]
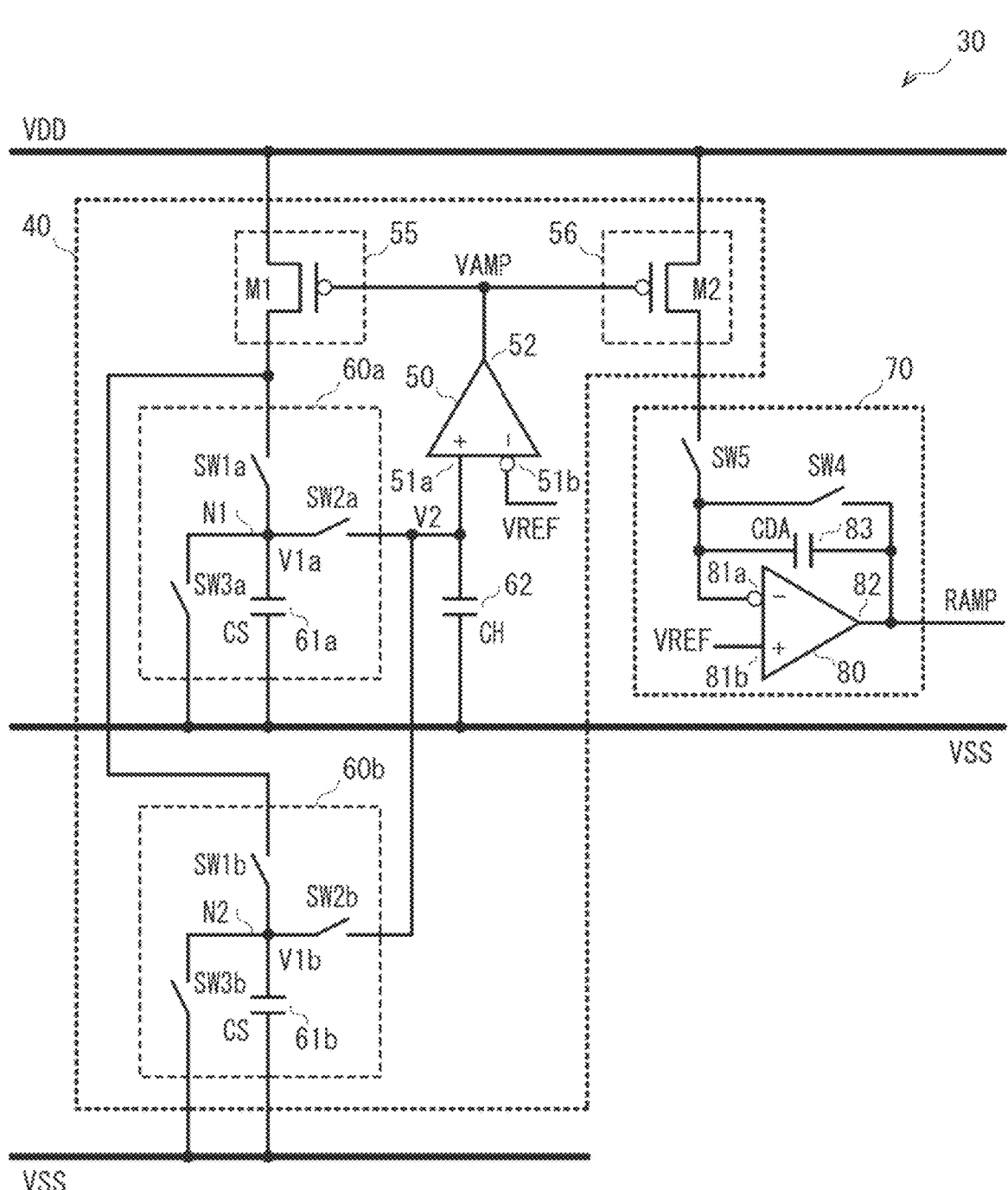

[ FIG. 6 ]
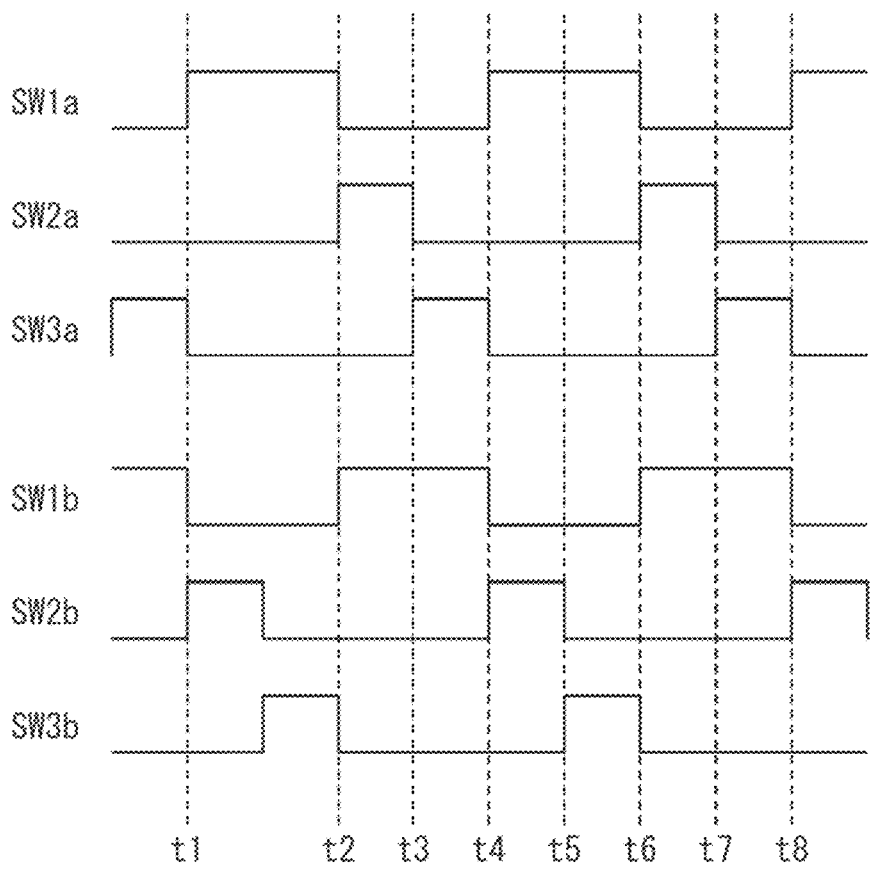

[ FIG. 7 ]
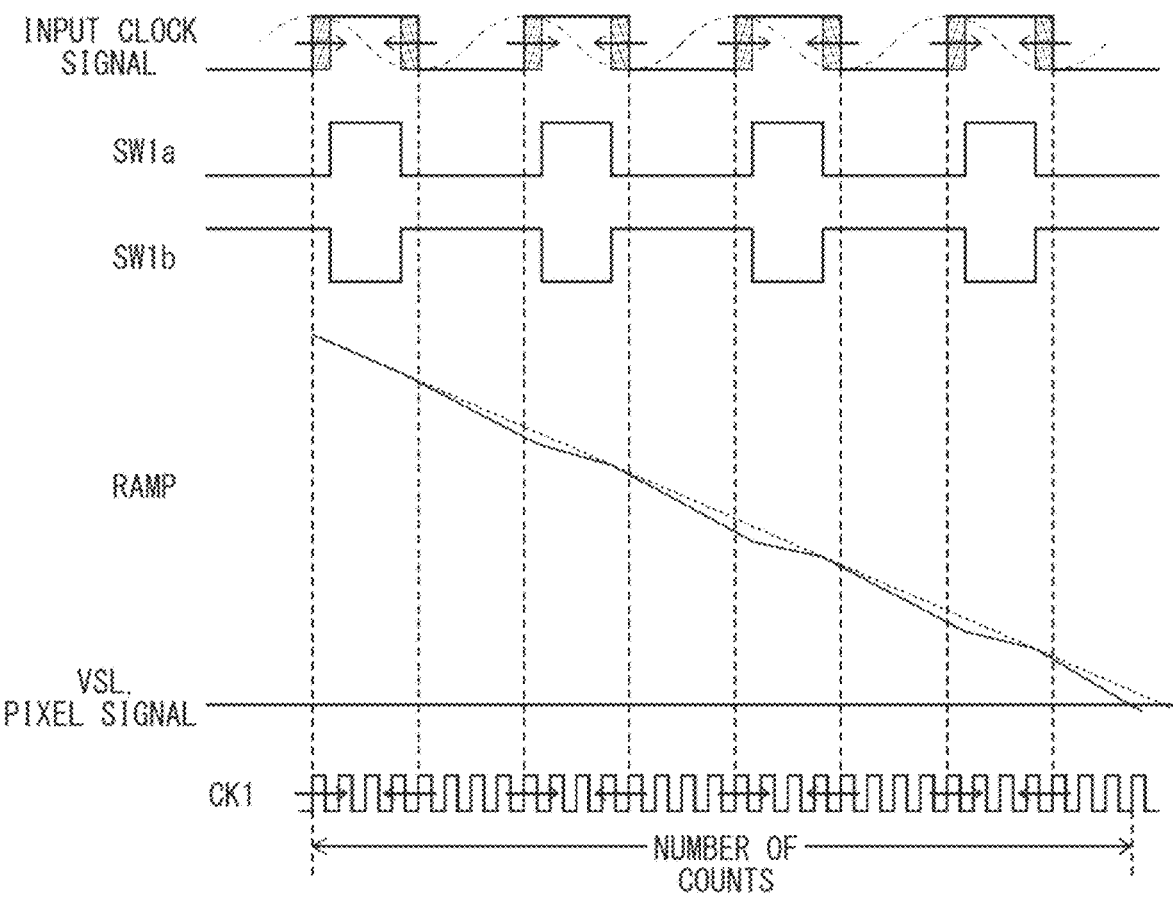

[ FIG. 8 ]
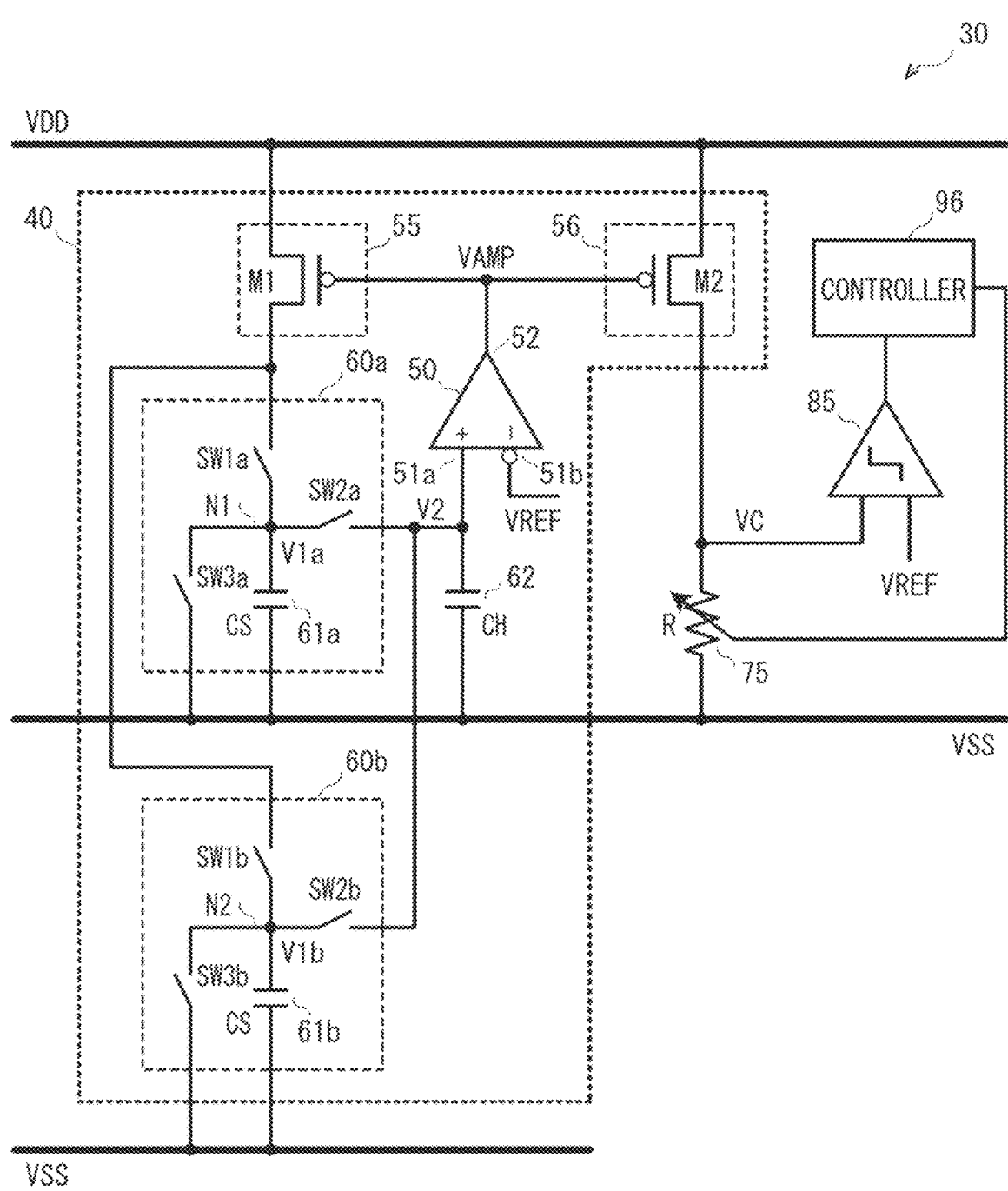

[ FIG. 9 ]
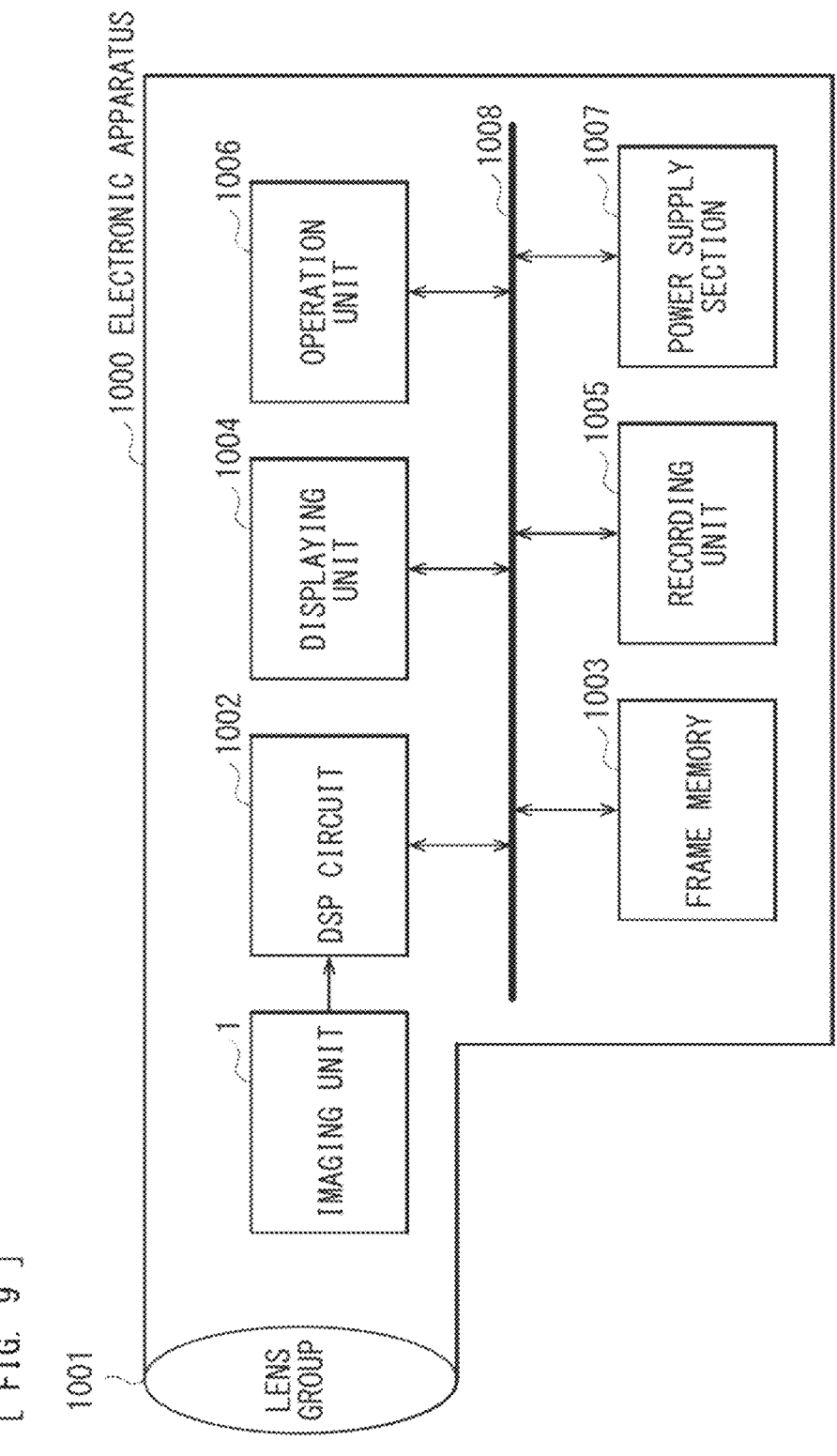

[ FIG. 10 ]
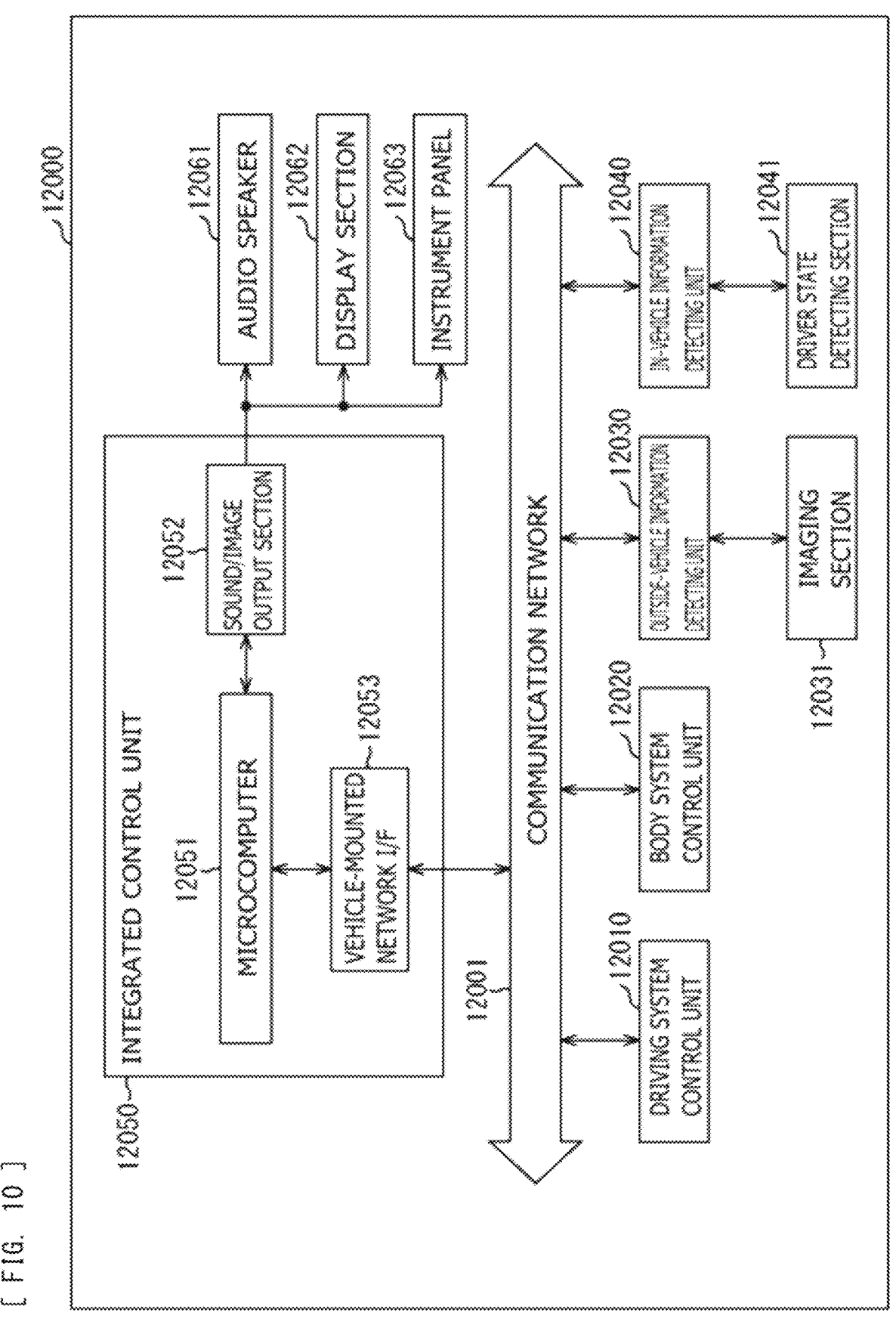

[ FIG. 11 ]
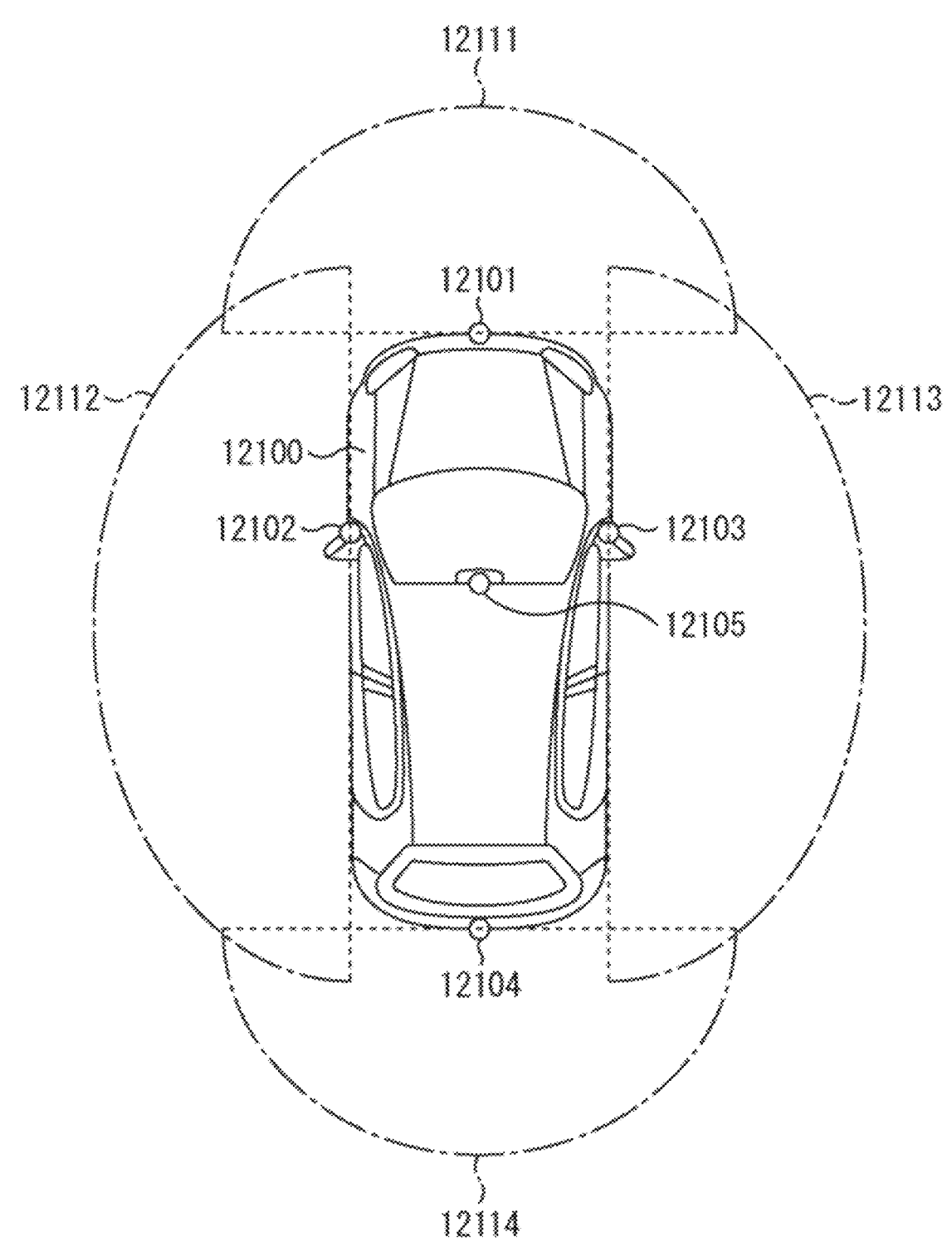

[ FIG. 12 ]
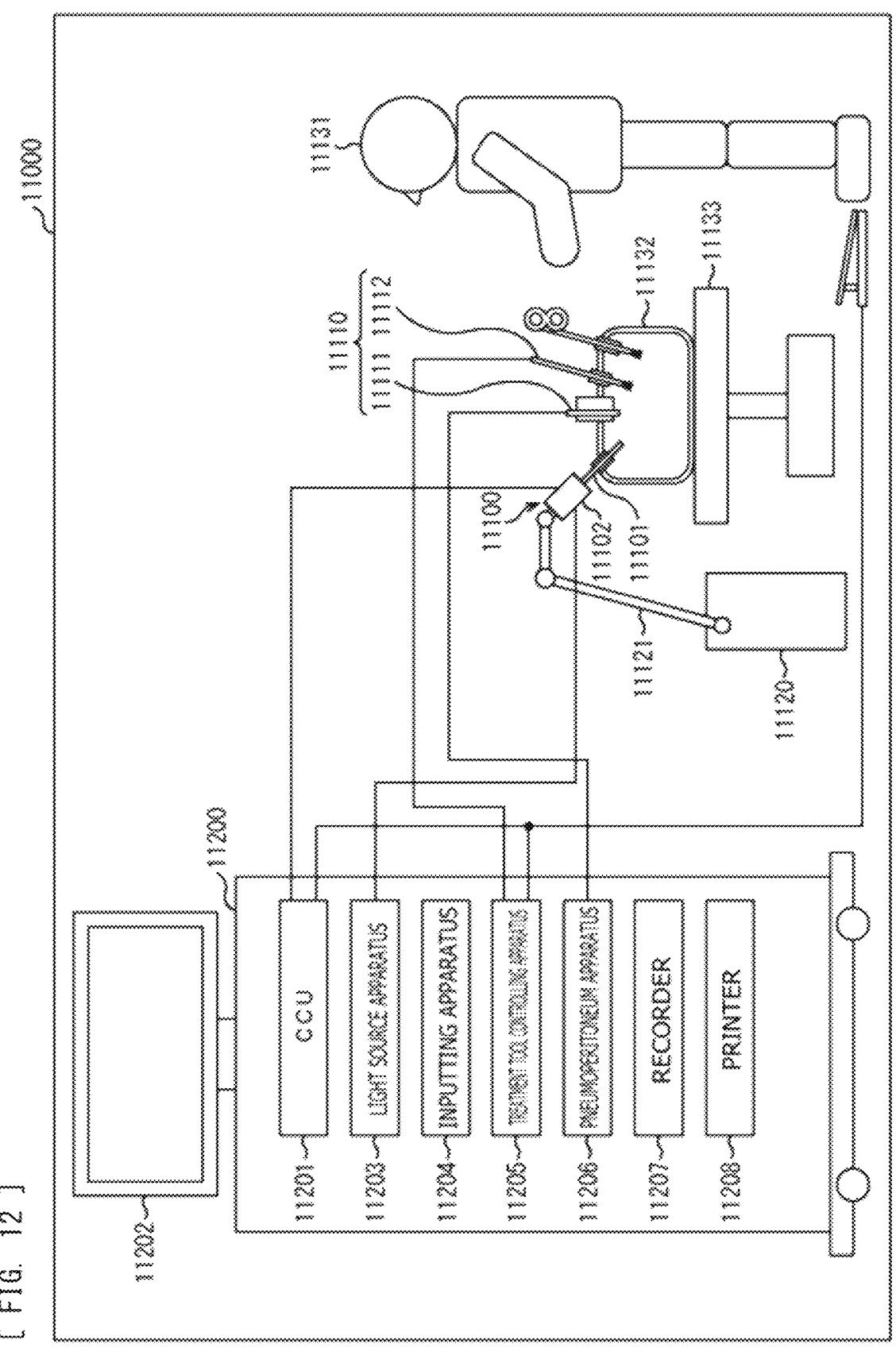

[ FIG. 13 ]
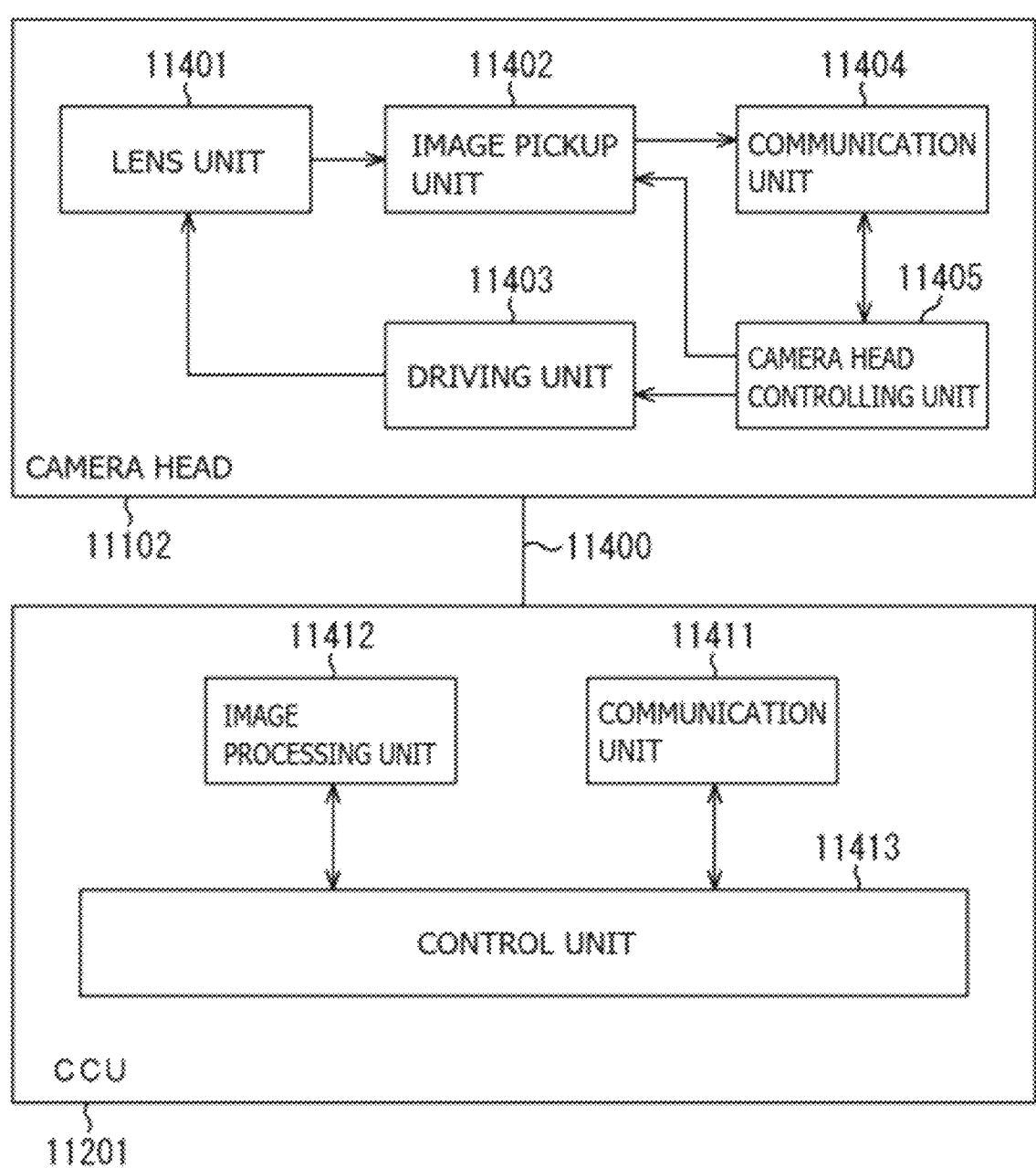

SIGNAL GENERATION CIRCUIT AND LIGHT DETECTING UNIT

TECHNICAL FIELD

The present disclosure relates to a signal generation circuit and a light detecting unit.

BACKGROUND ART

A circuit that generates a ramp voltage is proposed (Patent Literature 1). The circuit includes a plurality of voltage divider resistors that divide a reference voltage, and also includes a switched-capacitor integrator that operates in synchronization with an internal clock.

CITATION LIST

Patent Literature

Patent Literature 1: Japanese Unexamined Patent Application Publication No. 2003-60507

SUMMARY OF THE INVENTION

A signal generation circuit is demanded to suppress a deterioration in signal quality.

It is desired to provide a signal generation circuit that makes it possible to suppress a deterioration in the signal quality.

A signal generation circuit according to one embodiment of the present disclosure includes: an amplifier including a first input section, a second input section, and an output section; a first electric current source configured to supply an electric current on the basis of an output voltage of the output section; a first capacitor element configured to hold a voltage; a first switch configured to electrically couple the first electric current source and the first capacitor element to each other; a second switch configured to electrically couple the first capacitor element and the first input section to each other; a second capacitor element configured to hold a voltage; a third switch configured to electrically couple the first electric current source and the second capacitor element to each other; and a fourth switch configured to electrically couple the second capacitor element and the first input section to each other.

A light detecting unit according to one embodiment of the present disclosure includes: a light receiving element configured to receive light and generate a charge; a signal generation circuit configured to generate a first signal of which voltage changes; and a converter that converts a second signal that is based on the charge generated in the light receiving element, into a digital signal on the basis of the first signal. The signal generation circuit includes: an amplifier including a first input section, a second input section, and an output section; a first electric current source configured to supply an electric current on the basis of an output voltage of the output section; a first capacitor element configured to hold a voltage; a first switch configured to electrically couple the first electric current source and the first capacitor element to each other; a second switch configured to electrically couple the first capacitor element and the first input section to each other; a second capacitor element configured to hold a voltage; a third switch configured to electrically couple the first electric current source and the second capacitor element to each other; a fourth switch configured to electrically couple the second capacitor element and the first input section to each other; a second electric current source configured to supply an electric current on the basis of an output voltage of the output section; and a signal output section configured to output the first signal on the basis of the electric current supplied by the second electric current source.

BRIEF DESCRIPTION OF DRAWING

FIG. 1 is a diagram illustrating one example of a schematic configuration of an imaging unit serving as one example of a light detecting unit according to an embodiment of the present disclosure.

FIG. 2 is a diagram illustrating an example of the configuration of a pixel of the imaging unit according to the embodiment of the present disclosure.

FIG. 3 is a diagram used to describe an example of the configuration of a signal processor of the imaging unit according to the embodiment of the present disclosure.

FIG. 4 is a timing chart illustrating an example of operation of the imaging unit according to the embodiment of the present disclosure.

FIG. 5 is a diagram used to describe an example of the configuration of a signal generator of the imaging unit according to the embodiment of the present disclosure.

FIG. 6 is a timing chart illustrating an example of operation of the signal generator of the imaging unit according to the embodiment of the present disclosure.

FIG. 7 is a diagram illustrating one example of a waveform of a signal generated by the imaging unit according to the embodiment of the present disclosure.

FIG. 8 is a diagram illustrating an example of the configuration of a signal generator according to a modification example of the present disclosure.

FIG. 9 is a block diagram illustrating an example of the configuration of au electronic apparatus including an imaging unit.

FIG. 10 is a block diagram depicting an example of schematic configuration of a vehicle control system.

FIG. 11 is a diagram of assistance in explaining an example of installation positions of an outside-vehicle information detecting section and an imaging section.

FIG. 12 is a view depicting an example of a schematic configuration of an endoscopic surgery system.

FIG. 13 is a block diagram depicting an example of a functional configuration of a camera head and a camera control unit (CCU).

MODES FOR CARRYING OUT THE INVENTION

Below, embodiment according to the present disclosure will be described in detail with reference to the drawings. Note that description will be made in the following order.

1. Embodiment
2. Modification Example
3. Applied Example
4. Application Example

1. Embodiment

FIG. 1 is a diagram illustrating one example of a schematic configuration of an imaging unit serving as one example of a light detecting unit according to an embodiment of the present disclosure. An imaging unit 1 that is a light detecting unit includes an apparatus that makes it possible to detect entering light. The imaging unit (light detecting unit) 1 includes a plurality of pixels P including a light receiving element, and is configured to photoelectrically convert the entering light to generate a signal.

In the example illustrated in FIG. 1, the imaging unit 1 includes, as an imaging area, a region (pixel portion 100) in which the plurality of pixels P is two-dimensionally arranged in a matrix manner. The light receiving element (light receiving unit) of each of the pixels P includes, for example, a photodiode. The light receiving element makes it possible to receive light to generate a charge through photoelectric conversion.

The imaging unit 1 captures incident light (image light) from a subject through an optical system (not illustrated) including an optical lens. The imaging unit 1 takes an image of the subject formed through the optical lens system. The imaging unit 1 photoelectrically converts the received light to generate a pixel signal. For example, it is possible to use the imaging unit 1 in an electronic apparatus such as a digital still camera, video camera, or a mobile phone.

[Schematic Configuration of Imaging Unit]

In a peripheral region of the pixel portion 100, the imaging unit 1 includes, for example, a vertical drive section 111, a signal processor 112, a horizontal drive section 113, an output section 114, a controller 115, an input-output terminal 116, and the like, as illustrated in the example in FIG. 1.

For example, a plurality of pixel drive lines Lread and a plurality of vertical signal lines VSL are provided in the imaging unit 1. For example, in the pixel portion 100, the plurality of pixel drive lines Lread is wired for individual pixel rows each including the plurality of pixels P arranged in the horizontal direction (row direction). In addition, in the pixel portion 100, the vertical signal line VSL is wired for each pixel column including the plurality of pixels P arranged in the vertical direction (column direction). The pixel drive line Lread is configured to allow a drive signal used to read out a signal from a pixel P, to be transmitted through. The vertical signal line VSL is configured to allow a signal outputted from a pixel P, to be transmitted through.

The vertical drive section 111 includes a shift register, an address decoder, or the like. The vertical drive section 111 is configured to drive each of the pixels P in the pixel section 100. The vertical drive section 111 includes a pixel drive section, and generates a signal used to drive the pixel P to output it to each of the pixels P in the pixel section 100 through the pixel drive line Lread. The vertical drive section 111 generates, for example, a signal used to control a transfer transistor, a signal used to control a reset transistor, and the like, and supplies them to each of the pixels P through the pixel drive line Lread.

The signal processor 112 is configured to perform signal processing to an inputted signal from a pixel. The signal processor 112 includes, for example, a load circuit section, an A-D converter, a horizontal selection switch, and the like. The load circuit section is coupled to the vertical signal line VSL, and constitutes a source follower circuit in conjunction with an amplification transistor of the pixel P. Note that the signal processor 112 may include an amplification circuit section configured to amplify a signal read out from the pixel P through the vertical signal line VSL.

A signal outputted from each of the pixels P selected and scanned by the vertical drive section 111 is supplied to the signal processor 112 through the vertical signal line VSL. For example, the signal processor 112 performs signal processing such as A-D (Analog Digital) conversion, CDS (Correlated Double Sampling: correlated double sampling), or the like.

The horizontal drive section 113 includes a shift register, an address decoder, or the like. The horizontal drive section 113 is configured to drive a horizontal selection switch of the signal processor 112. The horizontal drive section 113 sequentially drives individual horizontal selection switches of the signal processor 112 while scanning them. Signal processing is applied, by the signal processor 112, to the signal of each of the pixels P transmitted through each of the vertical signal lines VSL, and the signal is sequentially outputted to the horizontal signal line 121 through selection and scanning by the horizontal drive section 113.

The output section 114 is configured to perform signal processing to the inputted signal to output the signal. The output section 114 applies signal processing to a signal of a pixel that is sequentially inputted from the signal processor 112 through the horizontal signal line 121, and outputs the signal after the processing. For example, the output section 114 may only perform buffering, or may perform adjustment of black level, correction of column variation, various types of digital signal processing, and the like.

The circuit section including the vertical drive section 111, the signal processor 112, the horizontal drive section 113, the horizontal signal line 121, and the output section 114 may be formed at a semiconductor substrate 11, or may be disposed at an external control IC. In addition, this circuit section may be formed at another substrate coupled through a cable or the like.

The controller 115 is configured to control each section of the imaging unit 1. The controller 115 receives a clock provided from the outside of the semiconductor substrate 11, data that gives an instruction as to an operating mode, or the like, and outputs data such as internal information regarding the imaging unit 1. The controller 115 includes a timing generator that generates various types of timing signals, and controls driving of peripheral circuits including the vertical drive section 111, the signal processor 112, the horizontal drive section 113, and the like on the basis of various types of timing signals generated at the timing generator. The input-output terminal 116 is configured to send and receive signals to and from the outside.

[Configuration of Pixel]

FIG. 2 is a diagram illustrating an example of the configuration of the pixel of the imaging unit according to the embodiment. The pixel P includes a photoelectric converter 12, a transistor TGL, a floating diffusion (FD), a transistor AMP, a transistor SEL, and a transistor RST.

Each of the transistor TGL, the transistor AMP, the transistor SEL, and the transistor RST includes a MOS transistor (MOSFET) including a gate terminal, a source terminal, and a drain terminal. In the example illustrated in FIG. 2, each of the transistors TGL, AMP, SEL, and RST is configured as a NMOS transistor. Note that the transistor of the pixel P may be configured as a PMOS transistor.

The photoelectric converter 12 is configured to generate a charge through photoelectric conversion. In the example illustrated in FIG. 2, the photoelectric converter 12 includes a photodiode (PD), and converts the entering light into a charge. The photoelectric converter 12 performs photoelectric conversion to generate a charge corresponding to the amount of light received.

The transistor TGL is configured to transfer, to the FD, the charge photoelectrically converted at the photoelectric converter 12. As illustrated in FIG. 2, the transistor TGL is controlled on the basis of the signal STGL, and electrically couple and disconnect the photoelectric converter 12 and the FD. The transistor TGL includes a transfer transistor, and makes it possible to transfer, to the FD, a charge that has been photoelectrically converted and accumulated at the photoelectric converter 12.

The FD serves as a charge accumulation section, and is configured to accumulate the transferred charge. The FD makes it possible to accumulate a charge that has been photoelectrically converted at the photoelectric converter 12. It may be possible to say that the FD includes a charge holder that holds the transferred charge. The FD accumulates the transferred charge, and converts it into a voltage corresponding to the capacitance of the FD.

The transistor AMP is configured to generate a signal based on the charge accumulated at the FD to output it. As illustrated in FIG. 2, the gate of the transistor AMP is electrically coupled to the FD, and a voltage converted at the FD is inputted thereinto. The transistor AMP includes an amplification transistor, and makes it possible to generate a signal based on the charge accumulated at the FD, that is, generate a signal based on a voltage at the FD, and output it to the vertical signal line VSL.

The transistor SEL is configured to control outputting of a signal from a pixel. The transistor SEL is controlled on the basis of a signal SSEL, and is configured to make it possible to output a signal from the transistor AMP to the vertical signal line VSL. The transistor SEL includes a selection transistor, and makes it possible to control timing of outputting a signal from a pixel. Note that the transistor SEL may be provided between the transistor AMP and a power-supply line through which a power-supply voltage is provided. In addition, it may be possible to employ a configuration in which no transistor SEL is provided, depending on applications.

The transistor RST is configured to make it possible to reset the voltage at the FD. The transistor RST is controlled on the basis of a signal SRST, and makes it possible to reset the charge accumulated at the FD to reset the voltage at the FD. The transistor RST is configured as a reset transistor.

The vertical drive section 111 (see FIG. 1) controls the signal STGL, the signal SSEL, the signal SRST, and the like that are inputted into each of the pixels P to cause a signal to be outputted from the transistor AMP of each of the pixels P to the vertical signal line VSL. For example, in a P phase (Pre-charge phase) period after the voltage at the FD is reset, the vertical drive section 111 makes it possible to read out, as a signal Sp, a signal corresponding to the voltage at the FD after resetting. The voltage of the signal Sp falls in a voltage (referred to as a reset voltage Vp) corresponding to the voltage at the FD after resetting.

Furthermore, in a D phase (Data phase) period after the charge is transferred from the photoelectric converter 12 to the FD, the vertical drive section 111 makes it possible to read out, as a signal Sd, a signal corresponding to the voltage at the FD after the charge is transferred. The voltage of the signal Sd falls in a voltage (referred to as a signal voltage Vd) corresponding to the voltage at the FD after the charge is transferred. The signal Sp and the signal Sd outputted from a pixel P are sequentially inputted, through the vertical signal line VSL, into the signal processor 112 that has been described above. In other words, the pixel P outputs, to the vertical signal line VSL, a signal having the reset voltage Vp corresponding to a P phase level and a signal voltage Vd corresponding to a D phase level.

FIG. 3 is a diagram used to describe an example of the configuration of a signal processor of the imaging unit according to the embodiment. The signal processor 112 includes an A-D converter 20 and a signal generator 30, as illustrated in FIG. 3. The A-D converter 20 is configured to convert an inputted analog signal into a digital signal. The A-D converter 20 includes an A-DC (Analog to Digital Converter).

The A-D converter 20 is provided for each of the plurality of vertical signal lines VSL. The A-D converter 20 is provided for each pixel column including a plurality of pixels P arranged in the vertical direction (column direction). The A-D converter 20 applies A-D conversion processing to signals (the signal Sp and the signal Sd) from a pixel that is an analog signal inputted from each of the pixels P through the vertical signal line VSL.

The controller 115 includes a PLL (Phase Locked Loop) 90 and a timing controller 95. The PLL 90 includes a phase synchronizing circuit, and is configured to generate a clock signal that is a signal in which a high level and a low level are repeated, and to output it. The PLL 90 generates a clock signal CK1 having a predetermined frequency on the basis of a base clock signal inputted, for example, from the outside, and supplies it to the timing controller 95 and the A-D converter 20. The controller 115 makes it possible to output the clock signal CK1 of which frequency is multiplied by the PLL 90.

The timing controller 95 is configured to control the signal generator 30 on the basis of the clock signal CK1 outputted from the PLL 90. The timing controller 95 outputs a signal used to control timing to the signal generator 30, on the basis of the clock signal CK1. The timing controller 95 supplies the signal generator 30 with a control signal synchronized with the clock signal CK1, and makes it possible to control operation of the signal generator 30. The timing controller 95 includes a timing control circuit (timing adjustment circuit), and, for example, supplies the signal generator 30 with a pulse signal, a clock signal, and the like used to perform on-off control of each of the switches of the signal generator 30.

The signal generator 30 is configured to make it possible to generate a base signal. The signal generator 30 makes it possible to generate a signal of which signal level changes over time. For example, the signal generator 30 is coupled commonly to each of the A-D converters 20, and generates a base signal (reference signal) used for A-D conversion to supply it to each of the A-D converters 20.

The signal generator 30 includes a D-A converter (DAC: Digital to Analog Converter), and is configured to generate a ramp signal that is an analog signal, so as to correspond to the control signal from the timing controller 95. In the example illustrated in FIG. 3, the signal generator 30 generates a ramp signal RAMP serving as a base signal that changes over time, on the basis of the pulse signal and the clock signal outputted from the timing controller 95 as the control signal.

The signal generator 30 causes the signal level of the ramp signal RAMP to change so as to be synchronized with the clock signal CK1 on the basis of the control signal from the timing controller 95, as schematically illustrated in FIG. 3. The timing controller 95 supplies the signal generator 30 with the control signal to control the timing of generation of the ramp signal RAMP, the amount (gradient) of change in the voltage of the ramp signal RAMP, and the like.

The A-D converter 20 includes an A-D conversion circuit, and includes a comparing section 21, an enable circuit 25, and a counter 26. The A-D converter 20 is configured such that an inputted signal of a pixel is converted into a digital signal having the predetermined number of bits. The A-D converter 20 includes a single slope ADC. The comparing section 21 includes a comparator circuit, and is configured to make it possible to compare a signal of a pixel with the base signal (reference signal). The comparing section 21 compares a signal of a pixel that is an analog signal serving as the target of conversion with the base signal serving as the target of comparison.

In the example illustrated in FIG. 3, the signals (the signal Sp and the signal Sd) outputted from the pixel P to the vertical signal line VSL are inputted into one of input terminals of the comparing section 21. The ramp signal RAMP is inputted from the signal generator 30 into the other input terminal of the comparing section 21. The comparing section 21 compares the signal outputted from the pixel P with the ramp signal RAMP of which voltage (electric potential) changes, and outputs a signal VCMP serving as a result of comparison. The signal VCMP outputted from the comparing section 21 includes a signal indicating which of the ramp signal RAMP and the signal outputted from the pixel P is greater or smaller.

The enable circuit 25 is configured, for example, as an AND circuit. The enable circuit 25 is configured to control outputting of a signal to the counter 26. The clock signal CK1 outputted from the PLL 90 and the signal VCMP indicating the result of comparison by the comparing section 21 are inputted into the enable circuit 25. In the case of the example illustrated in FIG. 3, when the signal VCMP is at the high level, the clock signal is inputted into the counter 26 through the enable circuit 25. When the signal VCMP is at the high level, the enable circuit 25 makes it possible to output, to the counter 26, a signal CK2 of which signal level changes in accordance with the clock signal CK1. The enable circuit 25 is also referred to as a clock enabler.

The counter 26 is configured to perform counting (count) in accordance with the inputted signal. In the example illustrated in FIG. 3, the counter 26 counts pulses of the signal CK2 inputted from the enable circuit 25. In other words, on the basis of the signal CK2, the counter 26 counts the clock signal CK1 during a period in which the signal VCMP outputted from the comparing section 21 is at the high level.

The counter 26 counts pulses of the clock signal CK1 during a period of time in which the signal VCMP is at the high level, thereby measuring a period of time until the result of comparison in the comparing section 21 is inverted, and outputting a signal indicating the count value. The A-D converter 20 makes it possible to hold, as a signal of a pixel after A-D conversion, a digital signal indicating the count value corresponding to the period of time from the start of comparison by the comparing section 21 to the inversion (change) of the result of comparison.

FIG. 4 is a timing chart illustrating an example of operation of the imaging unit according to the embodiment. On the same time axis. FIG. 4 schematically illustrates a signal (signal Sp, signal Sd) of a pixel outputted to the vertical signal line VSL, the ramp signal RAMP, the clock signal CK1, a ramp synchronization signal, the signal VCMP, and the signal CK2.

The ramp synchronization signal is generated by the timing controller 95 using the clock signal CK1 outputted from the PLL 90, and is supplied to the signal generator 30. As illustrated in FIG. 4, the signal generator 30 is synchronized with the ramp synchronization signal, and generates the ramp signal RAMP to output it. The counter 26 counts the signal CK2 that changes in association with the clock signal CK1. Thus, operation, by the signal generator 30, of generating the ramp signal RAMP and operation, by the counter 26, of counting are each performed in synchronization with the clock signal CK1. In a case where jitter occurs in the clock signal CK1, the signal CK2 temporally shifts in association with the jitter of the clock signal CK1, which makes it possible to suppress occurrence of shifting of the count value by the counter 26. It is possible to reduce mixture of a noise (for example, laterally drawn noise) in a signal from each pixel after A-D conversion.

In the P phase period illustrated in FIG. 4, upon the signal Sp having the reset voltage Vp being inputted into the A-D converter 20, the comparing section 21 of the A-D converter 20 compares the signal Sp and the ramp signal RAMP with each other. When the voltage of the ramp signal RAMP becomes lower than the reset voltage Vp as illustrated in FIG. 4, the comparing section 21 makes the voltage of the signal VCMP shift from the high level to the low level. By counting the number of pulses of the signal CK2 during a period of time in which the signal VCMP is at the high level, the counter 26 holds the count value (P phase count value=2 in FIG. 4) corresponding to the reset voltage Vp. The A-D converter 20 holds, as a digital signal based on the signal Sp, a digital signal indicating the count value corresponding to the reset voltage Vp of the signal Sp.

In the D phase period, when the signal Sd having the signal voltage Vd is inputted into the A-D converter 20, the comparing section 21 compares the signal Sd and the ramp signal RAMP with each other. When the voltage of the ramp signal RAMP becomes lower than the signal voltage Vd as illustrated in FIG. 4, the comparing section 21 makes the voltage of the signal VCMP shift from the high level to the low level. By counting the number of pulses of the signal CK2 during a period of time in which the signal VCMP is at the high level, the counter 26 holds the count value (D phase count value=8 in FIG. 4) corresponding to the signal voltage Vd. The A-D converter 20 acquires a digital signal indicating the count value corresponding to the signal voltage Vd of the signal Sd, as a digital signal based on the signal Sd. In this manner, the signal Sp and the signal Sd sequentially outputted from the pixel P are converted into a digital signal through A-D conversion at the signal processor 112.

The signal processor 112 performs signal processing such as correlated double sampling to a signal of a pixel that is to be subjected to A-D conversion. As one example, the signal processor 112 calculates a difference between the signal Sd and the signal Sp, and acquires the calculated difference (count value=6 in FIG. 4) as the pixel signal SIG. The signal processor 112 outputs the pixel signal SIG after signal processing, to the output section 114 through the horizontal signal line 121. The output section 114 makes it possible to sequentially output the inputted pixel signal SIG to the outside. Below, a more detailed description will be made of the signal generator 30 of the imaging unit 1 according to the present embodiment.

FIG. 5 is a diagram used to describe an example of the configuration of the signal generator of the imaging unit according to the embodiment. The signal generator 30 includes an electric-current generator 40 and a signal output section 70. The electric-current generator 40 is configured to generate a base electric current. The signal output section 70 is configured to output a ramp signal on the basis of the base electric current. In other words, the signal output section 70 includes a generator that makes it possible to generate a ramp signal. For example, the signal output section 70 includes an integrating circuit configured using an operational amplifier.

The electric-current generator 40 includes an amplifier 50, an electric current source 55, an electric current source 56, a first holding section 60*a*, a second holding section 60*b*, and a capacitor element 62, as illustrated in FIG. 5. The capacitor element 62 has a capacitance value CH, and is configured to hold a voltage. One of electrodes (terminals) of the capacitor element 62 is coupled to the amplifier 50, the first holding section 60a, and the second holding section 60b, and the other electrode of the capacitor element 62 is coupled to a reference potential line. In the example illustrated in FIG. 5, the reference potential line includes a grounding line (ground line). The capacitor element 62 includes a hold capacitor, and makes it possible to hold a voltage inputted from the first holding section 60a and the second holding section 60b.

The amplifier 50 includes, for example, an input unit 51a, an input unit 51b, and an output section 52, and is configured by using an amplification circuit that makes it possible to amplify a signal. In the example illustrated in FIG. 5, the input unit 51a of the amplifier 50 serves as a first input terminal, and is electrically coupled to the first holding section 60a, the second holding section 60b, and the capacitor element 62. A voltage V2 held at the capacitor element 62 is inputted into the input unit 51a. The input unit 51b of the amplifier 50 serves as a second input terminal.

A reference voltage VREF is inputted into the input unit 51b of the amplifier 50. Note that, in the example illustrated in FIG. 5, the input unit 51a serves as a positive input terminal, and the input unit 51b serves as a negative input terminal. The output section 52 of the amplifier 50 serves as an output terminal, and is electrically coupled to the electric current source 55 and the electric current source 56. The amplifier 50 makes it possible to output a voltage based on the voltage V2 inputted into the input unit 51a and the reference voltage VREF inputted into the input unit 51b, from the output section 52 to the electric current source 55 and the electric current source 56.

The electric current source 55 is configured to supply an electric current on the basis of a voltage VAMP that is an output voltage from the output section 52 of the amplifier 50. The electric current source 55 generates an electric current corresponding to the voltage VAMP, and supplies it to the first holding section 60a and the second holding section 60b.

In the example illustrated in FIG. 5, the electric current source 55 includes a transistor M1. The transistor M1 includes, for example, a PMOS transistor. One of the source and the drain of the transistor M1 is coupled to the first holding section 60a and the second holding section 60b. The other one of the source and the drain of the transistor M1 is coupled to the power-supply line to which a power supply voltage VDD is given. The gate of the transistor M1 is electrically coupled to the output section 52 of the amplifier 50. The transistor M1 generates an electric current I1 based on the voltage VAMP, and makes it possible to output the generated electric current I1 to the first holding section 60a and the second holding section 60b.

The first holding section 60a includes a plurality of switches and a capacitor element, and is configured to make it possible to hold a voltage. In the example illustrated in FIG. 5, the first holding section 60a includes a switch SW1a, a switch SW2a, a switch SW3a, and a capacitor element 61a. In addition, the first holding section 60a includes a node N1 where the switch SW1a, the switch SW2a, the switch SW3a, and the capacitor element 61a are coupled, as illustrated in FIG. 5.

The switch SW1a is provided between the electric current source 55 and the capacitor element 61a, and is configured to be able to electrically couple the electric current source 55 and the capacitor element 61a. The switch SW2a is provided between the capacitor element 61a and the capacitor element 62. The switch SW2a is configured to be able to electrically couple the capacitor element 61a and the capacitor element 62. The switch SW3a is provided between the capacitor element 61a and the reference potential line, and is configured to be able to electrically couple the capacitor element 61a and the reference potential line.

The capacitor element 61a has a capacitance value CS, and is configured to hold a voltage. One of electrodes of the capacitor element 61a is coupled to the node N1, and the other one of the electrodes of the capacitor element 61a is coupled to the reference potential line. The capacitor element 61a makes it possible to hold a voltage V1a corresponding to the electric current I1 supplied by the electric current source 55.

The second holding section 60b includes a plurality of switches and a capacitor element, and is configured to make it possible to hold a voltage. In the example illustrated in FIG. 5, the second holding section 60b includes a switch SW1b, a switch SW2b, a switch SW3b, and a capacitor element 61b. In addition, the second holding section 60b includes a node N2 where the switch SW1b, the switch SW2b, the switch SW3b, and the capacitor element 61b are coupled.

The switch SW1b is provided between the electric current source 55 and the capacitor element 61b, and is configured to be able to electrically couple the electric current source 55 and the capacitor element 61b. The switch SW2b is provided between the capacitor element 61b and the capacitor element 62. The switch SW2b is configured to be able to electrically couple the capacitor element 61b and the capacitor element 62. The switch SW3b is provided between the capacitor element 61b and the reference potential line, and is configured to be able to electrically couple the capacitor element 61b and the reference potential line.

The capacitor element 61b has a capacitance value CS, and is configured to hold a voltage. One of electrodes of the capacitor element 61b is coupled to the node N2, and the other electrode of the capacitor element 61b is coupled to the reference potential line. The capacitor element 61b makes it possible to hold a voltage V1b corresponding to the electric current I1 supplied by the electric current source 55.

The capacitor element 61a, the capacitor element 61b, and the capacitor element 62 each include a MOS capacitor, a MIM (Metal-Insulator-Metal) capacitor, or the like. Each of the switches (the switches SW1a and SW1b, switches SW2a and SW2b, and switches SW3a and SW3b) of the electric-current generator 40 is configured by using a transistor.

The timing controller 95 (see FIG. 3) of the controller 115 supplies a signal to each of the switches of the electric-current generator 40 to perform on-off control of each of the switches. The timing controller 95 supplies each of the switches with a signal used control each of the switches in accordance of the clock signal CK1 to switch the coupling state of each of the switches.

FIG. 6 is a timing chart illustrating an example of operation of the signal generator of the imaging unit according to the embodiment. The timing chart illustrated in FIG. 6 indicates a control signal (drive signal) supplied to each of the switches of the electric-current generator 40 with the horizontal axis indicating time. In FIG. 6, a switch into which a control signal at the high level is inputted is in an ON state (conducting state), and a switch into which a control signal at the low level is inputted is in an OFF state (non-conducting state).

During a period from time t1 to time t2 illustrated in FIG. 6, the switch SW1a in the first holding section 60a is in the ON state. As the switch SW1a is in the ON state, the electric current source 55 and the capacitor element 61a are electrically coupled to each other. In this case, as the capacitor element 61*a* is charged with the electric current I1 of the electric current source 55, a charge is accumulated at the capacitor element 61*a*, and the voltage at the capacitor element 61*a*, that is, the voltage V1*a* at the node N1 increases. In the first holding section 60*a*, the period from time t1 to time t2 is an integration period in which the electric current I1 supplied from the electric current source 55 is integrated by the capacitor element 61*a*.

During a period from time t2 to time t3, the switch SW1*a* is in the OFF state and the switch SW2*a* is in the ON state. As the switch SW2*a* is in the ON state, the capacitor element 61*a* and the capacitor element 62 are electrically coupled to each other. Thus, the charge accumulated at the capacitor element 61*a* is transferred (outputted) to the capacitor element 62 through the switch SW2*a*. The voltage at the capacitor element 61*a* and the voltage at the capacitor element 62 are averaged, which makes it possible to increase the voltage V2 at the capacitor element 62. In the first holding section 60*a*, the period from time t2 to time t3 is a transfer period in which the charge is transferred at the capacitor element 61*a* and the capacitor element 62.

During a period from time t3 to time t4, the switch SW2*a* is in the OFF state and the switch SW3*a* is in the ON state. As the switch SW3*a* is in the ON state, the capacitor element 61*a* and the reference potential line (grounding line) are electrically coupled to each other. Thus, the charge at the capacitor element 61*a* is discharged through the switch SW3*a*, which makes the voltage at the node N1 reduce. In the first holding section 60*a*, the period from time t3 to time t4 is a discharging period in which the voltage (charge) at the capacitor element 61*a* is reset.

Meanwhile, in the second holding section 60*b*, during the period from the time t2 to time t4, the switch SW1*b* is in the ON state, and the electric current source 55 and the capacitor element 61*b* are electrically coupled to each other. As the capacitor element 61*b* is charged with the electric current I1 of the electric current source 55, a charge is accumulated at the capacitor element 61*b*, and the voltage at the capacitor element 61*b*, that is, the voltage V1*b* at the node N2 increases. In the second holding section 60*b*, the period from time t2 to time t4 is an integration period in which the electric current I1 supplied from the electric current source 55 is integrated at the capacitor element 61*b*.

In addition, in the second holding section 60*b*, during a period from the time t4 to time t5, as the switch SW2*b* is in the ON state, the capacitor element 61*b* and the capacitor element 62 are electrically coupled to each other. With this operation, the charge held at the capacitor element 61*b* is transferred to the capacitor element 62 through the switch SW2*b*. In the second holding section 60*b*, the period from time t4 to time t5 is a transfer period in which the charge is transferred at the capacitor element 61*b* and the capacitor element 62.

During a period from time t5 to time t6, the switch SW3*b* turns into the ON state to electrically couple the capacitor element 61*b* and the reference potential line. The charge at the capacitor element 61*b* is discharged through the switch SW3*a*, which makes the voltage at the node N2 reduce. In the second holding section 60*b*, the period from time t5 to time t6 is a discharging period in which the voltage at the capacitor element 61*b* is reset. Note that the first holding section 60*a*, the period from time t4 to time t6 is the integration period.

In this manner, the signal generator 30 repeats accumulation of a charge by the first holding section 60*a* and transferring thereof, and accumulation of a charge by the second holding section 60*b* and transferring thereof. The signal generator 30 alternately turns the switch SW1*a* and the switch SW1*b* into the ON state to perform the accumulation operation of the first holding section 60*a* and the accumulation operation of the second holding section 60*b*. In addition, the signal generator 30 alternately turns the switch SW2*a* and the switch SW2*b* into the ON state to perform the transfer operation of the first holding section 60*a* and the transfer operation of the second holding section 60*b*. In this manner, the signal generator 30 causes the first holding section 60*a* and the second holding section 60*b* to perform the differential operation, thereby making it possible to generate the base electric current. In other words, the signal generator 30 includes a circuit having a differential configuration, and includes a bias circuit that makes it possible to generate a bias electric current or a bias voltage.

In the signal generator 30, the electric current I1 of the electric current source 55 is adjusted so that the voltage V2 at the capacitor element 62 that is inputted into the input unit 51*a* of the amplifier 50 is equal to the reference voltage VREF inputted into the input unit 51*b*. The electric current I1 of the electric current source 55 becomes an electric current having the size corresponding to a frequency of and the pulse width of a control signal inputted into the switches SW1*a* and SW1*b*, the capacitance value of the capacitor elements 61*a* and 61*b*, and the voltage value of the reference voltage VREF.

The electric current source 56 illustrated in FIG. 5 is configured to supply an electric current on the basis of the voltage VAMP that is an output voltage of the amplifier 50. The electric current source 56 generates an electric current corresponding to the voltage VAMP, that is, generates a base electric current I2 corresponding to the electric current I1 that flows through the electric current source 55, and makes it possible to supply it to the signal output section 70. The base electric current I2 is a value corresponding to the electric current I1 of the electric current source 55. It is possible to adjust the electric current value of the base electric current I2, for example, on the basis of the frequency of or the pulse width of the control signal for the switches SW1*a* and SW1*b*, the capacitance value of the capacitor elements 61*a* and 61*b*, the value of the reference voltage VREF, or the like.

In the example illustrated in FIG. 5, the electric current source 56 includes a transistor M2. The transistor M2 includes, for example, a PMOS transistor. One of the source and the drain of the transistor M2 is electrically coupled to the signal output section 70. The other one of the source and the drain of the transistor M2 is coupled to the power-supply line to which the power supply voltage VDD is given. The gate of the transistor M2 is electrically coupled to the output section 52 of the amplifier 50. The transistor M2 makes it possible to generate the base electric current I2 to output it to the signal output section 70.

As one example, the signal output section 70 includes an amplifier 80, a switch SW4, a switch SW5, and a capacitor element 83, as illustrated in FIG. 5. The amplifier 80 includes, for example, an input unit S1a, an input unit 81*b*, and an output section 82, and is configured by using an amplification circuit that makes it possible to amplify a signal. The input unit 81*a* serves as a first input terminal, and is electrically coupled to the electric current source 56 through the switch SW5. The input unit 81*b* serves as a second input terminal. The reference voltage VREF is inputted into the input unit 81*b*. The output section 82 serves as an output terminal. Note that, in the example illustrated in FIG. 5, the input unit 81a serves as a negative input terminal, and the input unit 81b serves as a positive input terminal.

The capacitor element 83 is coupled between the input unit Sla and the output section 82 of the amplifier 80. One of electrodes of the capacitor element 83 is coupled to the input unit 81a, and the other one of electrodes of the capacitor element 83 is coupled to the output section 82. The capacitor element 83 has a capacitance value CDA, and includes a capacitor (integrating capacitor) that integrates the base electric current I2 supplied by the electric current source 56, and holds a voltage.

The switch SW4 is provided between the input unit 81a and the output section 82, and is configured to be able to electrically couple the input unit 81a and the output section 82. The switch SW5 is provided between the electric current source 56 and the amplifier 80. The switch SW5 is configured to be able to electrically couple the electric current source 56, the capacitor element 83, and the input unit 81a of the amplifier 80. The capacitor element 83 includes a MOS capacitor, a MIM capacitor, and the like. The switches SW4 and SW5 are each configured by using a transistor.

The timing controller 95 (see FIG. 3) of the controller 115 supplies a signal to each of the switches of the signal output section 70 to perform on-off control of each of the switches. The timing controller 95 supplies the switches SW4 and SW5 with a signal used to control each of the switches in accordance of the clock signal CK1 to switch the coupling state of the switches SW4 and SW5.

The signal output section 70 is configured to output a ramp signal based on the base electric current I2 supplied by the electric current source 56. The signal output section 70 includes an integrating circuit, and makes it possible to generate the ramp signal RAMP of which voltage changes, on the basis of the base electric current I2. In other words, the signal output section 70 is a converter that convers the base electric current I2 into a voltage signal. In the example illustrated in FIG. 5, upon the switch SW4 turning into the ON state, the input unit Sla and the output section 82 of the amplifier 80 are electrically coupled to each other, and the voltage at the input unit 81a is reset to be a voltage of the reference voltage VREF.

After this, as the switch SW4 turns into the OFF state and the switch SW5 turns into the ON state, the base electric current I2 supplied from the electric current source 56 flows into the output section 82 through the capacitor element 83. In this case, the base electric current I2 is integrated by the amplifier 80 and the capacitor element 83, and the ramp signal RAMP is generated. It is possible to express the voltage VRAMP (amount of change) of the ramp signal RAMP as the following Equation (1), for example, by using the base electric current I2 of the electric current source 56, the capacitance value CDA of the capacitor element 83, and a period dt in which the switch SW5 turns into the ON state and integral is performed.

$$VRAMP = I2/CDA \times dt \qquad (1)$$

The signal output section 70 generates the ramp signal RAMP of which voltage level gradually changes from the reference voltage VREF, and makes it possible to output the ramp signal RAMP to the outside (each A-D converter 20 in FIG. 3).

As described above, the signal generator 30 according to the present embodiment includes the first holding section 60a and the second holding section 60b, and generates the ramp signal RAMP and the base electric current I2 through the differential operation of the first holding section 60a and the second holding section 60b. Thus, it is possible to suppress errors of the base electric current I2 and the ramp signal RAMP resulting from a variation in DUTY (duty) of the control signal (control signals of the switches SW1a and SW1b, and the like). In a case where DUTY varies due to jitter, it is possible to generate the ramp signal RAMP that is close to the targeted ramp signal. With the present embodiment, it is possible to generate the base electric current I2 and the ramp signal RAMP with high accuracy, and it is possible to suppress a deterioration in signal quality. It is possible to prevent a deterioration in the accuracy of A-D conversion.

FIG. 7 is a diagram illustrating one example of waveforms of signals generated by the imaging unit according to the embodiment. FIG. 7 illustrates, on the same time axis, the input clock signal, the control signal for the switch SW1a, the control signal for the switch SW1b, the ramp signal RAMP, the signal from a pixel outputted to the vertical signal line VSL, and the clock signal CK1. The input clock signal includes a signal generated on the basis of the clock signal CK1, and includes, for example, a signal obtained by dividing the clock signal CK1.

FIG. 7 schematically illustrates one example of jitter occurring in the input clock signal due to jitter of the clock signal CK1. In association with jitter (fluctuation) of the input clock signal, the pulse width of the high level of the control signal for the switch SW1a reduces, and the pulse width of the high level of the control signal for the switch SW1b increases.

As described above, the imaging unit 1 accumulates a charge at the first holding section 60a in a period in which the control signal for the switch SW1a is at the high level, and accumulates a charge at the second holding section 60b in a period in which the control signal for the switch SW1b is at the high level, thereby generating the ramp signal RAMP. Thus, it is possible to generate the ramp signal RAMP (solid line) substantially equal to the ideal ramp signal (dotted line), as illustrated in FIG. 7. It is possible to perform A-D conversion using the ramp signal RAMP that changes in synchronization with the clock signal CK1, which makes it possible to reduce an error of the count value due to jitter. Thus, it is possible to reduce mixture of a noise into the pixel signal, which makes it possible to prevent a deterioration in the quality of an image.

In the present embodiment, the first holding section 60a and the second holding section 60b having the differential configuration are provided. This makes it possible to improve the operation band of the signal generator 30, which makes it possible to improve the stability of the signal generator 30. In addition, it is possible to flatten a switching noise to reduce a variation (power supply drop) in the power supply voltage.

Workings and Effects

The signal generation circuit (signal generator 30) according to the present embodiment includes: the amplifier (amplifier 50) including the first input section, the second input section, and the output section; the first electric current source (electric current source 55) that makes it possible to supply an electric current on a basis of an output voltage of the output section; the first capacitor element (capacitor element 61a) that makes it possible to hold a voltage; the first switch (switch SW1a) configured to enable the first electric current source and the first capacitor element to be electrically coupled to each other; the second switch (switch SW2a) configured to enable the first capacitor element and the first input section to be electrically coupled to each other; the second capacitor element (capacitor element 61b) that makes it possible to hold a voltage; the third switch (switch SW1b) configured to enable the first electric current source and the second capacitor element to be electrically coupled to each other; and the fourth switch (switch SW2b) configured to enable the second capacitor element and the first input section to be electrically coupled to each other.

The signal generator 30 according to the present embodiment includes the first holding section 60a and the second holding section 60b. With this configuration, the signal generator 30 makes it possible to cause the first holding section 60a and the second holding section 60b to operate to generate the base electric current I2 and the ramp signal RAMP, which makes it possible to suppress a deterioration in the signal quality.

Next, a modification example of the present disclosure will be described. Below, the same reference characters are attached to constituent elements similar to those in the embodiment described above, and explanation thereof will not be repeated on an as-necessary basis.

2. Modification Example

It is possible to apply the technique according to the present disclosure to various types of circuits and apparatuses. For example, it is possible to use the signal generator 30 for calibration of a resistor. FIG. 8 is a diagram illustrating an example of the configuration of a signal generator according to a modification example of the present disclosure. In the example illustrated in FIG. 8, the signal generator 30 includes a resistor section 75, a voltage comparing section 85, and a resistor controller 96. The electric current source 56 generates a base electric current IREF that is an electric current corresponding to the voltage VAMP, and supplies it to the resistor section 75.

The resistor section 75 is controlled by the resistor controller 96, and is configured to be able to change the resistance value. The resistor section 75 includes a variable resistor section, and is electrically coupled to the electric current source 56 and the voltage comparing section 85. The voltage comparing section 85 includes, for example, a comparing circuit. A voltage VC corresponding to the base electric current IREF supplied by the electric current source 56 and the resistance value R of the resistor section 75 is inputted into either one of input terminals of the voltage comparing section 85. The reference voltage VREF is inputted into the other input terminal of the voltage comparing section 85. The voltage comparing section 85 compares the voltage VC and the reference voltage VREF with each other, and output an output signal that is a result of comparison.

The resistor controller 96 is configured to be able to control the resistor section 75. The resistor controller 96 makes it possible to change a resistance value of the resistor section 75 on the basis of an output signal from the voltage comparing section 85. For example, in a case where the voltage VC is lower than the reference voltage VREF, the resistor controller 96 controls the resistor section 75 on the basis of the output signal from the voltage comparing section 85 to increase the resistance value of the resistor section 75. With the present modification example, it is possible to calibrate a resistance using the base electric current IREF, which makes it possible to adjust the resistance value in a highly accurate manner.

3. Applied Example

It is possible to apply the imaging unit 1 or the like described above, for example, to various types of electronic apparatuses including an imaging function, which includes a camera system such as a digital still camera or a video camera, a mobile phone having an imaging function, and the like. FIG. 9 illustrates a schematic configuration of an electronic apparatus 1000.

The electronic apparatus 1000 includes, for example, a lens group 1001, the imaging unit 1, and a DSP (Digital Signal Processor) circuit 1002, a frame memory 1003, a displaying unit 1004, a recording unit 1005, an operation unit 1006, and a power supply section 1007, which are coupled to each other through a bus line 1008.

The lens group 1001 is configured to capture incident light (image light) from a subject to form an image on an imaging plane of the imaging unit 1. The imaging unit 1 converts the amount of incident light formed, as an image, by the lens group 1001 on the imaging plane, into an electric signal on a pixel basis, and supplies it to the DSP circuit 1002 as a pixel signal.

The DSP circuit 1002 includes a signal processing circuit that processes a signal supplied from the imaging unit 1. The DSP circuit 1002 outputs image data obtained through processing of a signal from the imaging unit 1. The frame memory 1003 is configured to temporarily hold, in a unit of frame, image data processed by the DSP circuit 1002.

The displaying unit 1004 includes, for example, a panel-type display apparatus such as a liquid crystal panel or an organic EL (Electro Luminescence) panel, and records image data regarding a moving image or a still image captured by the imaging unit 1, in a recording medium such as a semiconductor memory or a hard disk.

In response to an operation made by a user, the operation unit 1006 outputs an operation signal concerning various types of functions that the electronic apparatus 1000 has. The power supply section 1007 supplies various types of power supply serving as operational power supply of the DSP circuit 1002, the frame memory 1003, the displaying unit 1004, the recording unit 1005, and the operation unit 1006, to these targets of supply on an as-necessary basis.

4. Application Example (Application Example to Mobile Body)

It is possible to apply the technique (present technology) according to the present disclosure to various produces. For example, the technique according to the present disclosure may be achieved as an apparatus mounted on a mobile body of any type of an automobile, an electric car, a hybrid electric car, a motorcycle, a bicycle, a personal mobility, an airplane, a drone, a ship, a robot, and the like.

FIG. 10 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 10, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 10, an audio speaker 12061, a display section 12062, and an instrument panel 12063 are illustrated as the output device. The display section 12062 may, for example, include at least one of an on-board display and a head-up display.

FIG. 11 is a diagram depicting an example of the installation position of the imaging section 12031.

In FIG. 11, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 11 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by super-imposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic accel-eration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimen-sional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a col-lision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The micro-computer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

These are descriptions of one example of a mobile body control system to which the technique of the present disclo-sure is applicable. Of the configurations that have been described above, the technique of the present disclosure is applicable, for example, to an imaging section 12031. Spe-cifically, the imaging unit 1 or the like is applicable to the imaging section 12031, for example. By applying the tech-nique of the present disclosure to the imaging section 12031, it is possible to obtain a high definition captured image, and it is possible to perform highly accurate control using the captured image in a mobile body control system.

(Application Example to Endoscopic Surgery System)

It is possible to apply the technique (present technology) of the present disclosure to various products. For example, the technique of the present disclosure may be applied to an endoscopic surgery system.

FIG. 12 is a view depicting an example of a schematic configuration of an endoscopic surgery system to which the technology according to an embodiment of the present disclosure (present technology) can be applied.

In FIG. 12, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endo-scope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source of a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated timedivisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 13 is a block diagram depicting an example of a functional configuration of the camera head 11102 and the CCU 11201 depicted in FIG. 12.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera bead 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

These are descriptions of one example of an endoscopic surgery system to which the technique of the present disclosure is applicable. Of the configurations that have been described above, the technique of the present disclosure is favorably applicable, for example, to an image pickup unit 11402 provided at a camera head 11102 of an endoscope 11100. By applying the technique of the present disclosure to the image pickup unit 11402, it is possible to make the image pickup unit 11402 highly sensitive, which makes it possible to provide a high-definition endoscope 11100.

These are descriptions of the present disclosure made by giving the embodiment, the modification example, the applied example, and the application example. However, the present technology is not limited to the embodiment or the like described above, and various modifications are possible. For example, the modification example described above has been described as the modification example of the embodiment described above. However, it is possible to combine configurations of the individual modification examples on an as-necessary basis.

Description has been made by giving the imaging unit as an example. The light detecting unit according to the present disclosure is only necessary, for example, to receive incident light to covert light into a charge. The output signal may be a signal concerning image information, or may be a signal concerning distance information.

The signal generation circuit according to one embodiment of the present disclosure includes: the amplifier; the first electric current source; the first holding section including the first capacitor element, the first switch, and the second switch; and the second holding section including the second capacitor element, the third switch, and the fourth switch. By causing the first holding section and the second holding section to operate, it is possible to generate the base electric current I2 and the ramp signal RAMP, which makes it possible to suppress a deterioration in the signal quality.

Note that the effects described in the present Description are given merely as examples, and are not limited to those described therein. In addition, other effects may be possible. Furthermore, the present disclosure makes it possible to have the following configurations.

(1)

A signal generation circuit including:

an amplifier including a first input section, a second input section, and an output section;

a first electric current source configured to supply an electric current on the basis of an output voltage of the output section;

a first capacitor element configured to hold a voltage;

a first switch configured to electrically couple the first electric current source and the first capacitor element to each other;

a second switch configured to electrically couple the first capacitor element and the first input section to each other;

a second capacitor element configured to hold a voltage;

a third switch configured to electrically couple the first electric current source and the second capacitor element to each other; and a fourth switch configured to electrically couple the second capacitor element and the first input section to each other.

(2)

The signal generation circuit according to (1) described above, further including:

a second electric current source configured to supply an electric current on the basis of the output voltage of the output section.

(3)

The signal generation circuit according to (2) described above, further including:

a signal output section configured to output a first signal that is based on the electric current supplied by the second electric current source.

(4)

The signal generation circuit according to (3) described above, in which the signal output section includes an integrating circuit configured to generate the first signal of which voltage changes, on the basis of the electric current supplied by the second electric current source.

(5)

The signal generation circuit according to any one of (1) to (4) described above, in which the first capacitor element includes a first electrode electrically coupled to the first switch and the second switch, and the first capacitor element includes a second electrode electrically coupled to a reference potential line.

(6)

The signal generation circuit according to any one of (1) to (5) described above, in which the second capacitor element includes a first electrode electrically coupled to the third switch and the fourth switch, and the second capacitor element includes a second electrode electrically coupled to the reference potential line.

(7)

The signal generation circuit according to any one of (1) to (6) described above, further including:

a fifth switch configured to electrically couple the first electrode of the first capacitor element and the reference potential line to each other.

(8)

The signal generation circuit according to any one of (1) to (7) described above, further including:

a sixth switch configured to electrically couple the first electrode of the second capacitor element and the reference potential line to each other.

(9)

The signal generation circuit according to any one of (1) to (8) described above, further including:

a third capacitor element electrically coupled between the first input section and a reference potential line, and configured to hold a voltage.

(10)

The signal generation circuit according to (9) described above, in which the amplifier is configured to output a voltage that is based on the voltage at the third capacitor element inputted into the first input section and a reference voltage inputted into the second input section.

(11)

The signal generation circuit according to any one of (1) to (10), further including:

a controller configured to control the first switch and the second switch on the basis of a clock signal.

(12)

The signal generation circuit according to (11) described above, in which the controller is configured to alternately turn the first switch and the second switch into an ON state.

(13)

A light detecting unit including:

a light receiving element configured to receive light and generate a charge;

a signal generation circuit configured to generate a first signal of which voltage changes; and a converter that converts a second signal that is based on the charge generated in the light receiving element, into a digital signal on the basis of the first signal, in which the signal generation circuit includes:

an amplifier including a first input section, a second input section, and an output section;

a first electric current source configured to supply an electric current on the basis of an output voltage of the output section;

a first capacitor element configured to hold a voltage;

a first switch configured to electrically couple the first electric current source and the first capacitor element to each other;

a second switch configured to electrically couple the first capacitor element and the first input section to each other;

a second capacitor element configured to hold a voltage;

a third switch configured to electrically couple the first electric current source and the second capacitor element to each other;

a fourth switch configured to electrically couple the second capacitor element and the first input section to each other;

a second electric current source configured to supply an electric current on the basis of the output voltage of the output section; and a signal output section configured to output the first signal that is based on the electric current supplied by the second electric current source.

(14)

The light detecting unit according to (13) described above, in which the signal output section includes an integrating circuit configured to generate the first signal of which voltage changes, on the basis of the electric current supplied by the second electric current source.

This application claims priority based on Japanese Patent Application No. 2022-042857 filed on Mar. 17, 2022 with Japan Patent Office, the entire contents of which are incorporated in this application by reference.

It should be understood by those skilled in the art that various corrections, combinations, sub-combinations, and modifications may be reached depending on design requirements and other factors insofar as they are within the scope of the appended claims or the equivalents thereof.

The invention claimed is:

1. A signal generation circuit comprising:

an amplifier including a first input section, a second input section, and an output section;

a first electric current source configured to supply an electric current on a basis of an output voltage of the output section;

a first capacitor element configured to hold a voltage;

a first switch configured to electrically couple the first electric current source and the first capacitor element to each other;

a second switch configured to electrically couple the first capacitor element and the first input section to each other;

a second capacitor element configured to hold a voltage;

a third switch configured to electrically couple the first electric current source and the second capacitor element to each other; and a fourth switch configured to electrically couple the second capacitor element and the first input section to each other.

2. The signal generation circuit according to claim 1, further comprising:

a second electric current source configured to supply an electric current on a basis of the output voltage of the output section.

3. The signal generation circuit according to claim 2, further including:

a signal output section configured to output a first signal that is based on the electric current supplied by the second electric current source.

4. The signal generation circuit according to claim 3, wherein the signal output section comprises an integrating circuit configured to generate the first signal of which a voltage changes, on a basis of the electric current supplied by the second electric current source.

5. The signal generation circuit according to claim 1, wherein the first capacitor element includes a first electrode electrically coupled to the first switch and the second switch, and the first capacitor element includes a second electrode electrically coupled to a reference potential line.

6. The signal generation circuit according to claim 5, wherein the second capacitor element includes a first electrode electrically coupled to the third switch and the fourth switch, and the second capacitor element includes a second electrode electrically coupled to the reference potential line.

7. The signal generation circuit according to claim 6, further comprising:

a fifth switch configured to electrically couple the first electrode of the first capacitor element and the reference potential line to each other.

8. The signal generation circuit according to claim 7, further comprising:

a sixth switch configured to electrically couple the first electrode of the second capacitor element and the reference potential line to each other.

9. The signal generation circuit according to claim 1, further comprising:

a third capacitor element electrically coupled between the first input section and a reference potential line, and configured to hold a voltage.

10. The signal generation circuit according to claim 9, wherein the amplifier is configured to output a voltage that is based on the voltage at the third capacitor element inputted into the first input section and a reference voltage inputted into the second input section.

11. The signal generation circuit according to claim 1, further comprising:

a controller configured to control the first switch and the second switch on a basis of a clock signal.

12. The signal generation circuit according to claim 11, wherein the controller is configured to alternately turn the first switch and the second switch into an ON state.

13. A light detecting unit comprising:

a light receiving element configured to receive light and generate a charge;

a signal generation circuit configured to generate a first signal of which voltage changes; and a converter that converts a second signal that is based on the charge generated in the light receiving element, into a digital signal on a basis of the first signal, wherein the signal generation circuit includes:

an amplifier including a first input section, a second input section, and an output section;

a first electric current source configured to supply an electric current on a basis of an output voltage of the output section;

a first capacitor element configured to hold a voltage;

a first switch configured to electrically couple the first electric current source and the first capacitor element to each other;

a second switch configured to electrically couple the first capacitor element and the first input section to each other;

a second capacitor element configured to hold a voltage;

a third switch configured to electrically couple the first electric current source and the second capacitor element to each other;

a fourth switch configured to electrically couple the second capacitor element and the first input section to each other;

a second electric current source configured to supply an electric current on a basis of the output voltage of the output section; and a signal output section configured to output the first signal that is based on the electric current supplied by the second electric current source.

14. The light detecting unit according to claim 13, wherein the signal output section comprises an integrating circuit configured to generate the first signal of which a voltage changes, on a basis of the electric current supplied by the second electric current source.

* * * * *